United States Patent [19]
Hezel et al.

[11] Patent Number: 4,828,628
[45] Date of Patent: May 9, 1989

[54] SOLAR CELL

[75] Inventors: Rudolf Hezel, Spardorf; Karl G. Hackstein, Hanau, both of Fed. Rep. of Germany

[73] Assignee: Nukem GmbH, Hanau, Fed. Rep. of Germany

[21] Appl. No.: 59,264
[22] PCT Filed: Oct. 8, 1986
[86] PCT No.: PCT/EP86/00573
   § 371 Date: Jun. 10, 1987
   § 102(e) Date: Jun. 10, 1987
[87] PCT Pub. No.: WO87/02513
   PCT Pub. Date: Apr. 23, 1987

[30] Foreign Application Priority Data
Oct. 11, 1985 [DE] Fed. Rep. of Germany ....... 3536299

[51] Int. Cl.$^4$ .............................................. H01L 31/06
[52] U.S. Cl. ..................................... 136/255; 136/256; 357/30
[58] Field of Search ................ 136/255, 256; 357/30 J

[56] References Cited
U.S. PATENT DOCUMENTS

| | | | |
|---|---|---|---|
| 3,988,167 | 10/1976 | Kressel et al. | 136/256 |
| 4,253,881 | 3/1981 | Hezel | 136/256 |
| 4,315,097 | 2/1982 | Solomon | 136/256 |
| 4,463,216 | 7/1984 | Nakano et al. | 136/256 |
| 4,525,593 | 6/1985 | Yablonovitch | 136/255 |
| 4,540,843 | 9/1985 | Gochermann et al. | 136/251 |
| 4,642,414 | 2/1987 | Rasch et al. | 136/256 |
| 4,667,060 | 5/1987 | Spitzer | 136/255 |

FOREIGN PATENT DOCUMENTS

| | | | |
|---|---|---|---|
| 0118797 | 9/1984 | European Pat. Off. | 136/251 |
| 1614832 | 12/1970 | Fed. Rep. of Germany | 136/255 |
| 2846097 | 4/1980 | Fed. Rep. of Germany | 136/255 |
| 2303384 | 10/1976 | France | 136/256 |

OTHER PUBLICATIONS

J. Eguren et al., *Conference Record*, 15th *IEEE Photovoltare Specialists Conf.* (1981), pp. 1343–1348.

Primary Examiner—Aaron Weisstuch
Attorney, Agent, or Firm—Cushman, Darby & Cushman

[57] ABSTRACT

A solar cell (10), preferably of silicon, having a semiconductive substrate (1) on one side of which an electrical field is provided by, for example, an MIS contact (1, 2, 3) to cause a separation of charge carriers generated by light energy. The minority charge carriers are drawn into the metal (3) of the MIS contact, whereas the majority charge carriers are discharged via ohmic contact zones (4) arranged on the opposite side of the semiconductive substrate. At least one passivation layer (5) is arranged on the semiconductive substrate between the ohmic contact zones, whereby the recombination velocity of the charge carriers in the area of the ohmic contact zones is considerably reduced.

31 Claims, 4 Drawing Sheets

SOLAR CELL

The invention relates to a solar cell of a semiconductive material such as silicon, in whose semiconductive substrate charge carriers are generated by radiation energy, said charge carriers being separatable and so dischargable, with an ohmic contact being arranged on the semiconductive substrate.

The price for a solar cell module is made up in differing proportions of the costs for the solar cell itself and of those for encapsulating and framing the cell array to form modules. Manufacturing the solar cell entails in addition to the actual process costs the price for the semiconductive material as a prime factor. For this reason, major efforts are being undertaken worldwide to develop cheaper semiconductive material, with a deterioration of the electrical properties and a reduction in the efficiency of the solar cell being the usual consequences.

A further possibility for cutting the costs of solar cells, particularly when single-crystal and polycrystalline silicon is used, consists of drastically reducing the thickness of the semiconductive substrate and thus the material expenditure. In addition to this reduction in the semiconductive material, which has a very considerable effect on the overall price of the cell, there are further advantages for thin solar cells:

increase in the flexibility of solar cells, so permitting them to be fitted to curved surfaces;

increase of the performance/weight ratio, a particular advantage for space travel applications, but also for earth-based cells;

increased tolerance to high-energy radiation in space;

for example, thin silicon ribbons can be used, the manufacture of which becomes more economical as the ribbons become thinner;

reduced heating up of the cell, permitting higher operating voltage, provided the infra-red radiation is not absorbed in the cell;

possibility of structuring the cell to permit exploitation of the radiation striking from the rear surface of the solar cell, so achieving a considerably higher electrical output.

However, the reduction of the solar cell thickness also involves severe and fundamental problems: if the thickness of the semiconductive substrate drops below the respective diffusion length of the minority charge carriers, the result of the increased recombination of the charge carriers on the back surface of the solar cell is a considerable deterioration of the electrical properties (no-load voltage, short-circuit current) and thus of the efficiency of the solar cell.

To date, this problem has been solved, particularly in space travel cells, by generating an electrical field on the back surface of the solar cell. A potential barrier for minority charge carriers is built in at the back surface, so that said carriers cannot penetrate as far as the ohmic rear-surface contact and recombine there, because an ohmic contact is distinguished by an extremely high recombination velocity.

The electrical field on the back surface can be generated by incorporating impurity atoms in the rear side by means of diffusion from the gas phase, ion implantation, or very frequently by an alloying process. In an $n^+p$ silicon solar cell, boron or aluminum, for example, are incorporated into the p-doped silicon substrate to generate a $pp^+$ junction.

These methods are always expensive high-temperature processes which may reduce the carrier lifetime in the semiconductor volume in addition to creating numerous defects at the back surface, greatly reducing the efficiency of the electrical field and so leading to a considerable spread in the solar cell data in large-scale production. In addition, defects occur at the edges of the solar cell, and incomplete applying and poor diffusion result from "diffusion pipes". Furthermore, uneven penetration of the rear-surface metal and precipitation of impurities can be detected.

The object of the present invention is to design a solar cell of the type mentioned at the outset such that the recombination velocity in the area of the ohmic contact is considerably reduced without the usual provision of a potential barrier for minority charge carriers, with consequent simplification and cost-reduction of the manufacturing process, with the result that large-scale production of large-area olar cells, particularly silicon solar cells, is possible.

The object is attained on the one hand by a solar cell characterized in that the electrical field necessary for charge separation can be generated on the front of the solar cell, that the ohmic contact on the rear surface of the solar cell is in some areas arranged directly on the semiconductive substrate, the areas being interconected, and that at least a first passivation layer is arranged between the areas that do not comprise oxide present on the semiconductive substrate.

On the other hand, the object is attained by the electrical field necessary for charge separation being generatable on the rear of the solar cell, by the semiconductive material being in thickness smaller or equal to the diffusion length of the minority charge carriers, by the ohmic contact on the front of the solar cell being arranged in some areas directly on the semiconductive substrate, the areas being interconnected, and by there being at least a first passivation layer arranged between the areas that do not comprise oxide present on the semiconductive substrate.

In the solutions according to the invention, it is therefore proposed, among other measures, that the first passivation layer can be arranged directly on the semiconductive substrate, i.e. that there is no oxide layer between the semiconductive substrate and the first passivation layer.

By reducing the area of the ohmic contact, preferably by more than 90% of the semiconductive substrate area, the influence of the said contact on the recombination velocity is reduced accordingly. Of particular significance here is that recombination of the charge carriers in the area between the fields of the ohmic contact is greatly reduced by the passivation layer, also designated the insulator layer. This is ensured by a high quality for the passivation layer/semiconductor interface.

In an embodiment of the invention, the electrical field is preferably generated by a pin junction or an MIS contact. The MIS contact is preferably built up of p silicon, the natural silicon oxide layer and/or a silicon oxide layer generated at temperatures below 800° C., and aluminum or magnesium, with the MIS contact possibly extending over the entire rear surface of the solar cell.

Between the semiconductive substrate and the first passivation layer, there can also be a second passivation layer.

Moreover, in a further embodiment of the invention, an amorphous silicon layer containing hydrogen can be arranged between the semiconductive substrate and the first passivation layer, thereby increasing the efficiency of the solar cell.

In accordance with further embodiments of the invention, the first passivation layer is distinguished in that it contains hydrogen. It can therefore comprise silicon nitride or silicon oxynitride which is preferably generatable by deposition from the gas phase by reaction furnace in a glow discharge, by a photochemical effect, or by cathode sputtering, and in addition comprises foreign ions such as alkali ions or aluminum oxide or aluminum oxynitride. The range between 2 and 300 nm is the ideal thickness for the first passivation layer.

The solar cells manufactured in accordance with the principles of the invention, and particularly the ohmic contact areas on the rear surface which do not extend over the entire semiconductive substrate rear surface, provide the following advantages:

1. Low process expenditure is necessary to make the solar cells. An energy-saving and reliable layer deposition process at low temperatures takes place. The passivation layers can be deposited in a period from 2 to 20 minutes at temperatures of less than 600° C.

2. Easy handling is possible, which leads to an increase in the process yield when the cells are extremely thin, because there is less breakage.

3. The long-term stability of the solar cells is increased by good passivation of the rear surface and the edge, since the passivation layer prevents the penetration of foreign atoms from the outside and so protects both the metal and the semiconductor from damage.

4. A potential barrier is provided on the edge of the solar cell, preventing direct flow of minority charge carriers from the front to the rear (short-circuit, reduction of the parallel resistance). This is of particular significance in the case of the thin solar cells predominantly used. The possibility of short-circuiting is also precluded in the event that the metal on the front extends beyond the edge by mistake.

5. In the case of the passivation layers covering the edges of the solar cells, the front-surface contact can be extended to the rear surface and bonded there. Both connections on the rear surface of the solar cell have the advantage that in addition to the gains in active surface on the front due to the absence of a bonding pad, the bonding procedure is simplified, thereby increasing the reliability of the bonding process, an advantage which becomes very clear in automatic production operations.

6. The passivation layer designated as the insulator layer on the rear surface permits the emission of heat radiation. This prevents the cell from heating up and a higher operating voltage is obtained.

7. The radiation striking the rear of the solar cell is very thoroughly exploited, so providing a very effective and low-cost solar cell usable on both sides. While a relatively thick dead layer together with a high surface recombination speed $S_0$ is obtained during $p^+$ diffusion, so that short light wavelengths are very poorly exploited, the low value of $S_0$ in the array according to the invention covers all wavelengths well.

8. The passivation layer also serves as an anti-reflection layer.

9. It is no problem to design a rear-surface reflector in which a metal layer is deposited over the whole area of the passivation layer. On the one hand the heat radiation is reflected off said metal layer and forced to exit from the front of the solar cell; on the other hand the path of the longer-wave radiation, which is however usable for generating electron hole pairs, is extended and the short-circuit current thereby increased.

10. There are no particular requirements for the presence of definite charges in the passivation layer, so making the process considerably more reliable. Unlike the front surface in inversion-layer solar cells, where a strong inversion is necessarily present in the semiconductor due to corresponding insulator charges, it is irrelevant in the proposal according to the invention whether accumulation, depletion or inversion takes place. A substantial advantage of the principles of the invention is that even when inversion takes place (in the case of silicon nitride to p-silicon), the array functions optimally and the minority charge carriers do not flow predominantly along the conductive inversion layer to the ohmic contact areas and recombine there. It should however be noted that the surface recombination velocity during both accumulation and inversion is somewhat lower than in the case of depletion, since in the first two cases surface states are occupied with charge carriers. The presence of insulator charges is therefore advantageous, in addition to the main condition that low surface state density values must prevail at the insulator/semiconductor interface.

In this connection, it should not be omitted to mention that ohmic rear-surface contacts with grid structure are already prior art, but only in conjunction with a whole-area highly doped zone underneath, e.g. a $p^+$ zone with p-doped solar cell substrate. Here, the $p^+$ zone must not be too thin, as otherwise the dark current proportion from this zone increases as a result of increased recombination. A reduction of the voltage is the result. Frequently, a metal or oxide layer is deposited onto the known $p^+$ zone, said layer partly serving to reduce the surface recombination velocity and partly to act as a rear surface reflector or as an anti-reflection layer.

Further details, advantages and features of the invention can be found not only in the claims, and the features which may be gathered therefrom—for themselves and/or in combination—but also in the following description of the drawings indicating preferred embodiments.

Figure 1:
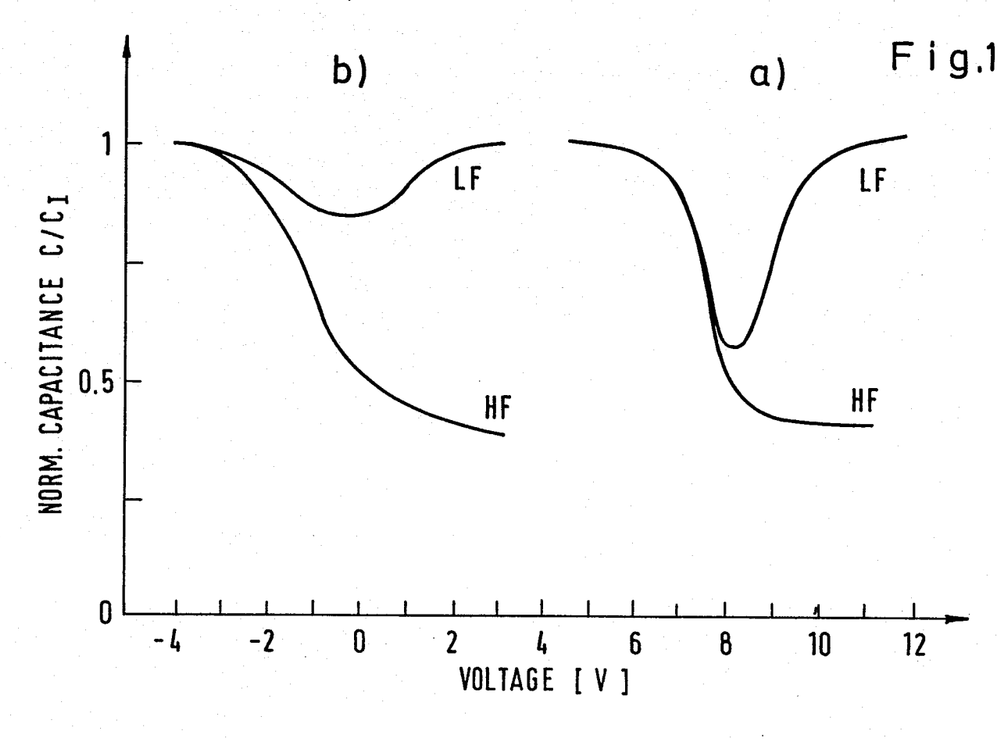
FIG. 1 shows capacitance/voltage curves of preferred passivation layers.

FIG. 1 illustrates the high- and low-frequency capacitance/voltage curves of the capacitor structure of first and second passivation layers particularly suited to surface passivation. This involves a layer structure of p(100) silicon-silicon oxide-$Al_2O_3$-aluminum, with the thickness of the silicon oxide layer being 1.5 nm and that of the $Al_2O_3$ layer 960 nm. The silicon substrate with (100) orientation is p-doped. Curve a shows the high- and low-frequency capacitance/voltage curve at an $Al_2O_3$ deposition temperature of 500° C., curve b that at 290° C. The $Al_2O_3$ layer is made by pyrolysis of the organometallic compound Al-triisopropylate. The thin silicon oxide layer was generated by thermal oxidation in $N_2/O_2$ gas at 510° C. As FIG. 1 shows, a 290° C.

Al$_2$O$_3$ deposition temperature resulted in negative flat band voltages (i.e. positive insulator charges) and high surface state densities (D$_{it}$~10$^{12}$ cm$^{-2}$eV$^{-1}$). It is substantially more favorable to deposit Al$_2$O$_3$ at 500° C. In addition to the now negative insulator charges, there is now above all a considerably lower surface state density D$_{it}$=8×10$^{10}$ cm$^{-2}$eV$^{-1}$, making the layer structure so prepared very suitable for low-temperature surface passivation of solar cells according to the invention.

Even more favorable with respect to surface state densities and thus of surface recombination velocities are the conditions for use of plasma silicon nitride. Unlike Al$_2$O$_3$, the insulator charges here are always positive. Relatively high surface state densities (D$_{it}$>10$^{12}$ cm$^{-2}$eV$^{-1}$) were measured on p (100) silicon - 1.5 nm Si-oxide - 100 nm Si-nitride - Al structures at a 200° C. deposition temperature (of NH$_3$+SiH$_4$). After annealing at 450° C., however, this value dropped to D$_{it}$<1×10$^{10}$ cm$^{-2}$eV$^{-1}$. Similarly, low D$_{it}$ values are obtained by deposition of the plasma silicon nitride layers at temperatures between 400° C. and 500° C. The positive insulator charge density also drops from Q$_I$/q=6.5×10$^{12}$cm$^{-2}$ at 200° C. to Q$_I$/q=1×10$^{12}$ cm$^{-2}$ at temperatures above 400° C.

At high temperatures exceeding 500° C., the surface state density rises again while the charges remain almost constant. This makes the plasma silicon nitride structures particularly suitable for surface passivation (low surface recombination velocity) of solar cells thanks to their extremely low surface state densities at deposition-/annealing temperatures between 400° C. and 500° C. These favorable characteristics are due to the hydrogen present in the insulator layers, which saturates the dangling bonds of the silicon.

This advantageous low-temperature passivation of semiconductive surfaces now permits, in accordance with the idea of the invention, effective passivation of solar cell surfaces to be achieved in conjunction with ohmic contacts, i.e. the insulator layer can, for example, be deposited, after the ohmic aluminum contacts have been made, onto the silicon surface and above these contacts (simultaneously protecting said contacts from corrosion and serious damage).

Passivation with thermal SiO$_2$ layers on silicon, said layers being manufactured at temperatures in excess of 850° C., would, in addition to causing high-temperature damage to the semiconductor, require a complex photomasking step with SiO$_2$ etching to be able to apply the ohmic contacts at a later stage. Said contacts would then also have no outside protection.

The previously described passivation method in the vicinity of contact surfaces provided directly on the semiconductive substrate now permits manufacture of thin solar cell structures in particular, distinguished by their simplicity, inexpensive manufacture and effectiveness. It is, however, important in all cases to keep the area of the ohmic contacts (very high recombination rate) as small as possible. The embodiments in FIGS. 2 to 4 should make clear further details and advantages of the invention.

Figure 2:
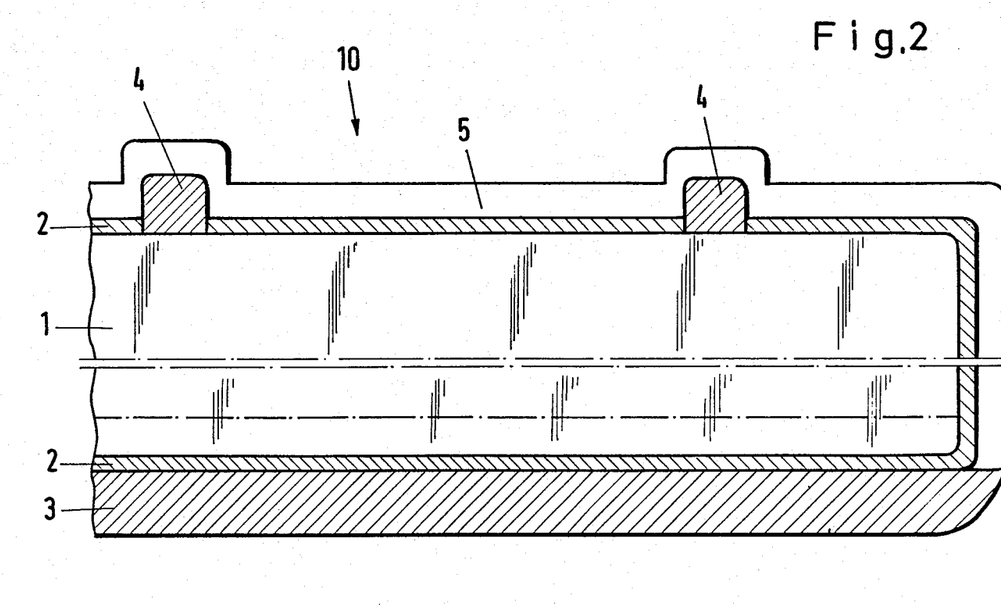
FIG. 2 shows a first embodiment of a silicon solar cell according to the invention having an ohmic contact on the front surface.

FIG. 2 shows an embodiment of a solar cell 10 constructed in accordance with the invention worthy of particular attention, said cell comprising a p-doped silicon substrate as the body 1, a thin silicon oxide layer 2, ohmic contacts 4 directly arranged on the silicon body 1, and an MIS (metal insulator semiconductor) contact composed of the p-silicon of silicon body 1, the silicon oxide layer 2 and a metallized layer 3 preferably of aluminum or magnesium. The incident light generates electrons and holes in silicon body 1. The electrons (minority charge carriers) diffuse toward the rear MIS contact 1, 2, 3 and are drawn by the electrical field of the said contact into metal 3 after tunnelling through oxide layer 2. The holes (majority charge carriers) diffuse towards the front and leave the silicon via the ohmic contact 4. An electrical current therefore flows in an outer circuit (front surface + pole, rear surface - pole of solar cell 10, (unlike solar cell 20 (FIG. 3), solar cell 30 (FIG. 4))). Since the silicon oxide layer 2 of the MIS contact acts as a tunnel insulator for the minority charge carriers, a thickness of 3 nm should not be exceeded. The boundary of the space charge zone of the MIS contact is shown by the dash-dotted line in the drawing. The electrical field prevailing there is for collection of the minority charge carriers. The ohmic contacts 4 are shown discontinuously applied to the semiconductive substrate, i.e. not covering the whole area e.g. less than 20% thereof. The ohmic contacts 4 can here form a geometric pattern formed by interconnected stripes, rings, or dots. Passivation layers extend between the ohmic contact zones 4, being composed of the silicon oxide layer 2 grown naturally or generated at less than 800° C., and of a further insulator layer, which can serve as a passivation layer and as an anti-reflection layer. The thickness of the top, designated the first passivation layer 5 can be approx. 80 nm and preferably comprises aluminum oxide or silicon nitride. The further insulator layer, designated the second passivation layer, in the form of silicon oxide layer 2, can be built up differently on the front and rear surface of the silicon substrate 1. It is therefore possible to vary the thickness on the front surface within wide limits, as the layer does not act as a tunnel insulator. It is of course also possible to dispense with layer 2 completely, i.e. in the area of the first passivation layer 5—as is also the case in the combination of FIGS. 3 and 4.

Both the natural silicon oxide layer and a silicon oxide layer 2, specially prepared for example by thermal or other oxidation methods, can be used for the surface passivation effect central to the invention. By natural silicon oxide layer is meant that layer which is always present on the silicon substrate 1 and is only a few atomic layers thick.

The structural composition of the silicon oxide layer 2 itself can be changed on the front surface by subsequent deposition of the first passivation layer 5, e.g. silicon nitride. It is therefore possible, for example, to convert silicon oxide into silicon oxynitride.

Unlike in conventional solar cells, the charge carriers generated by the light, predominantly near the front surface, must first diffuse through the entire substrate 1 in order to be collected by the MIS contact on the rear surface. It is important here that the front surface has a low surface recombination velocity, as otherwise a major proportion of the charge carriers would recombine there. The distance between the ohmic contacts 4, also called contact fingers and characterized by very high recombination, should be considerably greater than the substrate thickness d or the diffusion length of the minority charge carriers, so that on average the distance to the collecting MIS contact is less than that to the ohmic contact area. The distance between the ohmic contact fingers 4 is limited by the series resistance, which is increased by excessively low ohmic contact areas to the silicon body 1. The optimum distance is in the range from 1 to 5 mm, the finger width in the range 50–300 μm, thereby achieving a contact surface proportion of less than 10%. Cell 10 has, unlike conventional cells where the collecting contacts are on the front surface, a collection efficiency that increases the thinner the semiconductive substrate is and the greater its diffusion length L is (d≦L). The maximum efficiency is obtained with a thickness d of silicon substrate 1 of approx. 50–80 μm. This permits a saving in expensive semiconductive material and so a considerably cheaper production of the solar cell. A further advantage of this cell is that the rear-surface metal 3 serves as a reflector for large light wavelengths, leading to an increase in the short-circuit current and lower heating up of the cell during operation (higher open circuit voltage). Moreover, the entire cross-section of the cell is exploited for the current flow, and the minority charger carriers do not have to flow to the contacts in a narrow area of high sheet resistance (e.g. n+ emitter area in n+p solar cell) along the surface. A higher fill factor is therefore programmed. The solar cell 10 is therefore also particularly suitable for concentrated sunlight.

Figure 3:
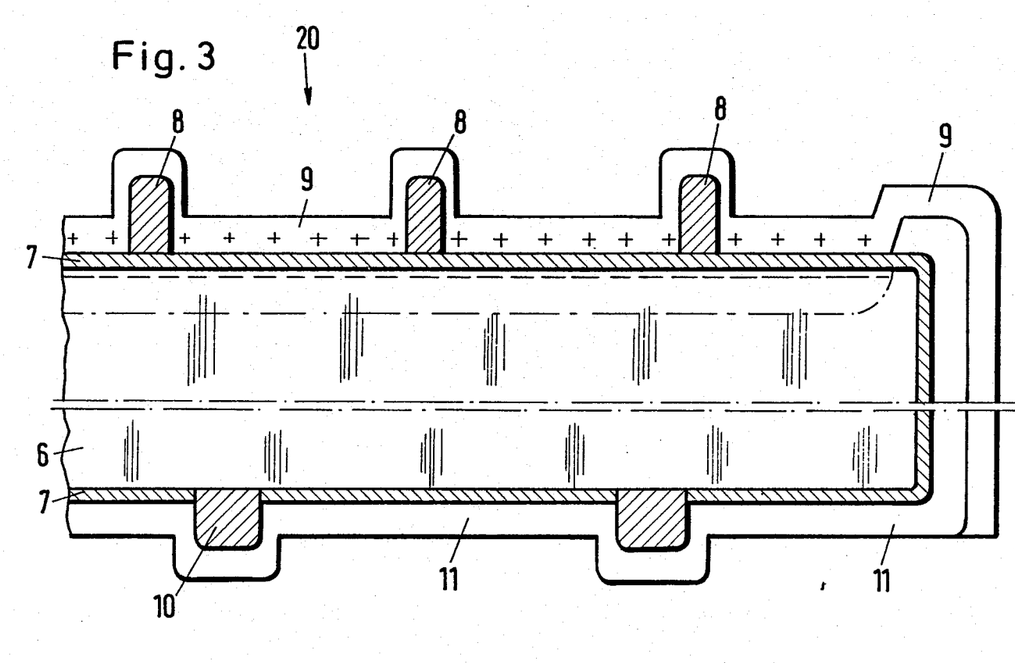
FIG. 3 shows a silicon solar cell having an ohmic contact on the rear surface.

It is also possible to design the MIS rear-surface contact not over the whole surface, but in grid form, for example, with the intermediate area between the MIS contacts being filled with an insulator layer (preferably silicon nitride). The insulator layer must for example contain positive charges in the case of p silicon, in order to induce an inversion layer in silicon along which the minority charge carriers (in the case of p-silicon electrons) can reach the MIS contacts. Two embodiments are possible here:

(a) The insulator layer can—as is the case with the front surface of MIS inversion layer solar cell 20 shown in FIG. 3—extend over the MIS contacts, i.e. their deposition/post deposition-treatment temperature must be correspondingly low (≦350° C. in the case of Al/SiO$_x$/p-Si MIS contacts), so that the MIS contacts are not irreparably damaged. This is a very simple process from the technological viewpoint, and ensures at the same time that the solar cell can also be illuminated from the rear surface.

(b) The insulator layer can however also be broken on the rear surface, with the metal (MIS contact) being located on the thin oxide (∼1 nm–1.5 nm) in these finger-shaped openings extending over certain areas (solar cell with light incidence from both sides). The metal can, however, also extend over the entire insulator layer (e.g. thin silicon oxide/silicon nitride), thereby providing an ideal backsurface reflector.

The structures described under b) with broken insulator layer permit application of the insulator layer at higher temperatures (≦600° C. prior to metallization) and so achieve better interface properties (lower surface state density etc.). The manufacturing process is however considerably more expensive due to the use of photo-masking and alignment.

Figure 4:
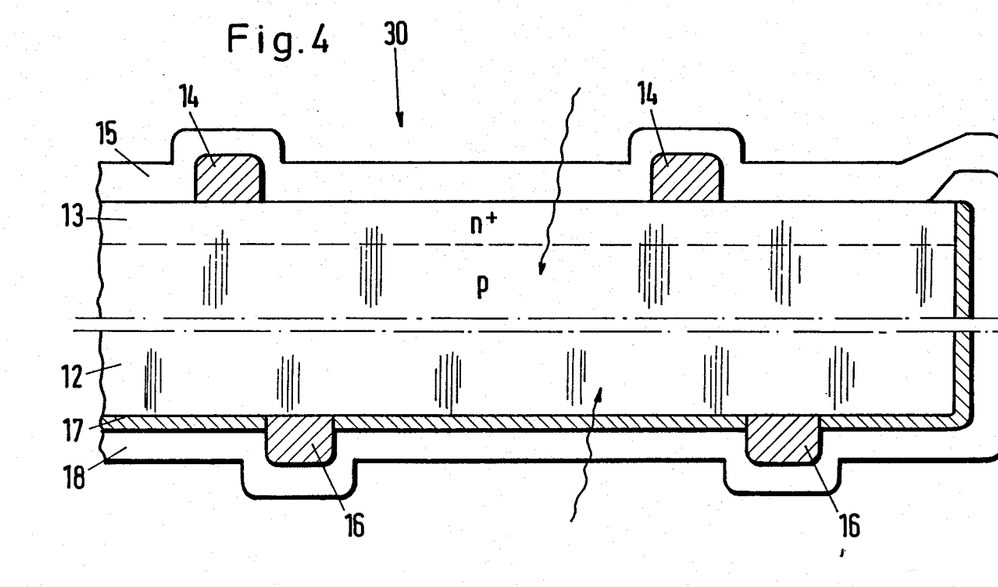
FIG. 4 shows a further embodiment of a silicon solar cell having an ohmic contact on the rear surface.

FIGS. 3 and 4 illustrate further embodiments of solar cells 20 and 30 that comply with the principles of the invention. The respective ohmic contact is arranged on the rear surface of solar cell 20 or 30, likewise in certain areas, as already made clear in connection with FIG. 2. The solar cell 20 shown in FIG. 3 corresponds to the design principle according to the silicon nitride inversion-layer solar cell with MIS contact described in U.S. Pat. No. 4,253,881. The silicon substrate or body 6 thus has a thin silicon oxide layer 7 which corresponds to the oxide layer 2 on the rear of the solar cell structure shown in FIG. 2, particularly in the area of the MIS contacts. In the area between the MIS contacts, the oxide layer 7 can be varied in thickness within wide limits; what was stated with respect to the oxide layer 2 on the front of the solar cell structure 10 shown in FIG. 2 is applicable here. The metals of the MIS contacts 8, preferably in the form of aluminum or magnesium, are arranged on the front of the solar cell 20, preferably in strips. A further insulator layer 9 extends over the entire surface of the solar cell, said layer preferably comprising silicon nitride. A high density of positive charges comprising the natural charges and those produced by foreign ions must be located in this silicon nitride layer 9, and induce an inversion layer comprising electrons on the surface of the p-doped silicon substrate 6. The electrons (minority charge carriers) generated by the light diffuse towards the front, unlike solar cell 10 (FIG. 2), are accelerated in the electrical field generated by the positive insulator charges, and travel along the highly conductive inversion layer to the MIS contacts 6, 7, 8, through which they leave the silicon body and pass into an external circuit. The holes diffuse towards the rear surface and leave the silicon body 6 via the ohmic contacts 10 (front surface—pole, rear surface + pole of solar cell 20 (as is the case in solar cell 300 too )). Passivation of the area between the ohmic contacts 10 prevents the electrons recombining with the holes there, particularly in the case of light incidence from the rear surface, and so escaping exploitation. The high density of positive charge is indicated by the plus sign in layer 9, and the inversion layer by the broken line. Furthermore, the dash-dotted line indicates the width of the space charge zone. The silicon nitride layer 9 can—unlike the passivation layer dealt with in the present invention (layer 5 in FIG. 2, layer 11 in FIG. 3 and layer 18 in FIG. 4)—only be deposited or annealed at low temperature (≦300° C.), as otherwise the MIS contacts would be greatly affected.

For that reason, it is not possible in a simple manner to exploit the effect described in the present invention of reducing the surface recombination velocity by applying or annealing passivation layers onto the front surface at temperatures between 300° C. and 600° C. This can only be achieved by a more expensive process, for example, by interrupting the insulator layer 9 on the front surface and providing the MIS contact in these finger-shaped openings using metal strips 8. It is thereby possible to apply or anneal the insulator layer here too at higher temperatures (≦600° C.), followed by metal deposition. Unlike the above case, however, expensive structuring steps are required. The rear surface of the solar cell according to FIG. 3 comprises ohmic contacts 10 in strip form (preferably aluminum) and the double insulator layer between said contacts and at the edge, said layer being formed of the thin silicon oxide layer 7 and the insulator layer 11, preferably aluminum oxide or silicon nitride.

This rear-surface array, on which the present embodiments center, corresponds to the front surface of the solar cell 10 illustrated in FIG. 2, with the remarks made on the oxide layer 2 (corresponding to layer 7 in FIG. 3) deserving particular mention.

Rear-surface passivation in combination with the ohmic contact area 10 represents a process fully compatible with this type of low-temperature cell (MIS inversion-layer solar cell), since temperature treatment between 400° C. and 600° C. as used for deposition or annealing of the rear-surface insulator layer 11 is necessary anyway to generate the tunnel oxide layer 7 on the front surface and to form the ohmic contacts 10. These processes naturally precede formation of the MIS contacts 8 and deposition of the anti-reflection layer 9 on the front surface. This cell type is particularly suited for thin substrates 6 where edge passivation to prevent a short-circuit between the front and rear surface usually presents a problem. This is automatically solved in this case by the application of passivation layers, i.e. of insulator layers. As can be seen from FIG. 3, a potential barrier forms in the semiconductor on the top surface of the cell near the edge due to the two insulator layers 9 and 11 overlapping, and prevents the charge carriers on the semiconductive surface flowing to the rear surface at the edges. The potential barrier results from a very high positive charge density in the front-surface insulator layer 9 and a negative—or at least greatly reduced positive—charge density in the rear-surface and edge insulator layer 11. As FIG. 3 shows, the entire solar cell 20 is enclosed by the impermeable insulator layers 9 and 11, and is so protected from outside influences. the rear-surface passivation introduced with this invention now enables all the benefits of a thin solar cell to be achieved, including reduced heating-up effects.

A particular advantage has proved to be that the cell 20 now exploits very effectively the radiation striking both surfaces, i.e. also the radiation striking from behind, dispersed, or reflected off white surfaces. The insulator layer 11 on the rear surface therefore also serves as an anti-reflection layer. It is thus possible to increase considerably the output of cell 20. A simple cell type, capable of being manufactured at low temperatures, was therefore provided with reduced use of expensive semiconductive material 6, almost without additional cost, and with which sunlight could be exploited to a much greater degree. Short-wave light in particular is well exploited thanks to the higher quality of the rear surface. Previous experience shows that the light striking from the rear is converted to current with an efficiency only 10% less than the light striking the front surface. If radiation striking from the rear is not to be used, a back-surface reflector is easily provided by applying a metal layer to the rear-surface insulator layer 11. In addition, front and rear surfaces can be textured to increase the light coupled into the cell.

A solar cell 30 in accordance with the principles of the invention is described using FIG. 4. The cell can be a conventional n+p or p+n solar cell. The n+p solar cell 30 illustrated in the embodiment comprises a semiconductive substrate 12, a highly doped surface layer 13 (here n+), an ohmic contact 14 in grid form, and a front-surface anti-reflection layer 15. Ohmic contacts 16, also not arranged over the entire surface and preferably in grid form, are located on the rear surface, as are the passivation layers characterizing the present invention, preferably in the form of a silicon oxide layer 17 and an insulating layer 18 doubling as an anti-reflection layer. The insulating layer 18 is preferably made of aluminum oxide or silicon nitride. By the formation of an n+p solar cell 30 on the rear surface in accordance with the invention, a solar cell designed for light incidence from both sides is provided in a simple manner, with the additional advantage that the long-wave heat radiation exits from cell 30 so that the operating temperature drops (increase in open circuit voltage). In addition, texturing of the rear surface in particular is easily possible. In addition to edge passivation by means of layers 17 and 18, it is possible to achieve a complete enclosure of cell 30 with impermeable insulator layer 18 or 15 as a protection. It is furthermore possible to apply a metal layer as rear-surface reflector to the insulator layer 18.

This solar cell 30 (FIG. 4) differs from the MIS inversion-layer solar cell 20 (FIG. 3) in that a surface layer highly doped with foreign atoms (e.g. phosphorus) is applied by a high-temperature process to the silicon body 12, so that an n+p junction and thus an electrical field is generated between the layers 12 and 13. The electrons generated by the light follow the electrical field to the surface, where they pass along the highly conductive n+ layer 13 to the ohmic contacts 14 into an external circuit. The holes pass to the rear surface and leave the silicon body 12 via the ohmic contacts 16 (front surface—pole, rear surface + pole of solar cell 30).

So whereas in the case of solar cell 30 the silicon body practically comprises two sections 12 and 13, the solar cells 10 (FIG. 2) and 20 (FIG. 3) are homogenous silicon bodies 1 and 6 respectively, which are not altered by the manufacturing process of the cell.

We claim:

1. A solar cell comprising
a substrate layer of semiconductor material, in which energy from a radiation source generates minority and majority charge carriers, the substrate layer having a first surface adapted to face toward said radiation source and a second surface adapted to face away from said radiation source;
a plurality of spaced apart ohmic contacts electrically coupled to one another and positioned directly on the first surface for collecting majority carriers;
a passivation layer covering the ohmic contacts and the spaces therebetween; and
means for providing an electrical field separating the minority and majority charge carriers in the region of the second surface, so that the majority charge carriers diffuse to the ohmic contacts and are collected by them.

2. A solar cell according to claim 1
wherein the ohmic contacts cover less than 20% of the area of the first surface, the distance between two adjacent ohmic contacts being greater than the diffusion length of the minority charge carriers, and greater than the thickness of the substrate layer, and
wherein the means for providing an electrical field separating the minority and majority charge carriers comprises:
a metal insulator semiconductor contact.

3. A solar cell according to claim 2 wherein said substrate layer has a thickness that is less than or equal to the diffusion length of the minority charge carriers in the substrate layer.

4. A solar cell according to claim 2 wherein said metal insulator semiconductor contact includes an insulating layer formed on said second substrate surface, and said insulating layer is silicon oxide.

5. A solar cell according to claim 2 wherein said MIS contact extends over the entire second surface of said cell.

6. A solar cell according to claim 1 wherein said passivation layer comprises silicon nitride.

7. A solar cell according to claim 1 wherein said passivation layer comprises silicon oxynitride.

8. A solar cell according to claim 1 wherein said passivation layer comprises aluminum oxide.

9. A solar cell according to claim 1 wherein said passivation layer comprises aluminum oxynitride.

10. A solar cell according to claim 1 wherein said passivation layer comprises silicon oxide.

11. A solar cell according to claim 1 wherein said passivation layer contains hydrogen.

12. A solar cell according to claim 1 wherein said passivation layer has a thickness of 2-300 nm.

13. A solar cell comprising:
a substrate layer of semiconductor material, in which energy from a radiation source generates minority and majority charge carriers, the substrate layer having a first surface facing a front surface of the cell and a second surface facing a rear surface of the cell;
a first passivation layer in the form of an insulating layer formed on said first substrate surface;
metal insulator semiconductor contacts formed on said first passivation layer for collecting minority carriers;
ohmic contacts formed directly on said second substrates surface for collecting majority carriers, the ohmic contacts covering less than 20% of the surface area of said second substrate surface, the distance between ohmic contacts being greater than the diffusion length of the minority charge carriers, and greater than the thickness of the substrate layer; and
a second passivation layer covering the ohmic contacts and the spaces therebetween;
an electrically charged insulating layer formed over said metal insulator semiconductor contacts and said first passivation layer at least in the areas between said metal insulator semiconductor contacts.

14. A solar cell according to claim 13 wherein said MIS contacts comprise aluminum.

15. A solar cell according to claim 13 wherein said MIS contacts comprise magnesium.

16. A solar cell according to claim 13 wherein said first passivation layer comprises silicon oxide.

17. A solar cell according to claim 13 wherein said second passivation layer comprises silicon oxide.

18. A solar cell according to claim 13 wherein said first insulating layer is silicon nitride.

19. A solar cell according to claim 13 wherein said ohmic contacts are aluminum.

20. A solar according to claim 13 wherein said second passivation layer is aluminum oxide.

21. A solar cell according to claim 13 wherein said second passivation layer is silicon nitride.

22. A solar cell according to claim 13 wherein said substrate layer has a thickness that is less than or equal to the diffusion length of the minority charge carriers in the substrate layer.

23. A solar cell according to claim 13 wherein said second passivation layer has a thickness of 2-300 nm.

24. A solar cell according to claim 13 wherein the cell is adapted to receive radiation at its front surface.

25. A solar cell according to claim 13 wherein said cell is adapted to receive radiation at its rear surface.

26. A solar cell according to claim 13 wherein said cell is adapted to receive radiation at both its front and rear surfaces.

27. A solar cell according to claim 13 wherein said MIS contacts are arranged in strips.

28. A solar cell according to claim 13 wherein said first passivation layer covers the entire front surface of the cell.

29. A solar cell according to claim 13 wherein said ohmic contacts are arranged in grid form.

30. A solar cell according to claim 13 wherein said second passivation layer comprises silicon oxynitride.

31. A solar cell according to claim 13 wherein said second passivation layer comprises aluminum oxynitride.

* * * * *